United States Patent
Murakami (10) Patent No.: US 8,134,134 B2
(45) Date of Patent: Mar. 13, 2012

(54) PARTICLE ATTACHMENT PREVENTING METHOD AND SUBSTRATE PROCESSING APPARATUS

(75) Inventor: Takahiro Murakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 230 days.

(21) Appl. No.: 12/612,990

(22) Filed: Nov. 5, 2009

(65) Prior Publication Data

US 2010/0117008 A1     May 13, 2010

(30) Foreign Application Priority Data

Nov. 10, 2008    (JP) ................................ 2008-287735

(51) Int. Cl.
    *G21G 5/00*          (2006.01)
(52) U.S. Cl. ................ 250/492.2; 250/492.1; 250/492.3
(58) Field of Classification Search ............... 250/492.1, 250/492.2, 492.21; 438/706, 707, 710
See application file for complete search history.

(56) References Cited

U.S. PATENT DOCUMENTS

| | | | |
|---|---|---|---|
| 2003/0003758 A1* | 1/2003 | Moriya et al. | 438/710 |
| 2005/0042881 A1* | 2/2005 | Nishimoto et al. | 438/710 |
| 2008/0233756 A1* | 9/2008 | Ito et al. | 438/710 |
| 2008/0277062 A1* | 11/2008 | Koshimizu et al. | 156/345.28 |
| 2009/0223450 A1* | 9/2009 | Moriya et al. | 118/723 R |
| 2009/0294064 A1* | 12/2009 | Nagayama | 156/345.39 |

FOREIGN PATENT DOCUMENTS

JP      2003-68708      3/2003

* cited by examiner

*Primary Examiner* — Michael Maskell
(74) *Attorney, Agent, or Firm* — Oblon, Spivak, McClelland, Maier & Neustadt, L.L.P.

(57) ABSTRACT

In a particle attachment preventing method in a substrate processing apparatus, an electron density control power supplied from the second power supply is adjusted such that an electron density above the substrate gets lower than during a plasma processing, for a preset short period of time after the plasma processing is ended, and a bias power supplied from the first power is maintained for the preset short period of time. The second power supply is a high frequency power supply for supplying a high frequency power having a frequency that is higher than that of the bias power, and in said adjusting of the electron density control power, the high frequency power supplied from the second power supply is lowered as compared with that during the plasma processing.

8 Claims, 4 Drawing Sheets

PARTICLE ATTACHMENT PREVENTING METHOD AND SUBSTRATE PROCESSING APPARATUS

CROSS-REFERENCE TO RELATED APPLICATIONS

This application claims priority to Japanese Patent Application No. 2008-287735 filed on Nov. 10, 2008, the entire contents of which are incorporated herein by reference.

FIELD OF THE INVENTION

The present invention relates to a particle attachment preventing method and a substrate processing apparatus; and more particularly, to a particle attachment preventing method in a substrate processing apparatus in which a plasma processing is performed on a substrate mounted on a mounting table to which a bias power is supplied.

BACKGROUND OF THE INVENTION

In a substrate processing apparatus including an accommodation chamber for accommodating a substrate, e.g., a semiconductor wafer, therein and a mounting table arranged inside the accommodation chamber to mount the wafer thereon, when the wafer is subjected to a plasma processing, a plasma is generated in the accommodation chamber and the plasma (electrons and positive ions) is attracted to the wafer mounted the mounting table by supplying a bias power to the mounting table.

Typically, a semiconductor device is manufactured from a wafer. If particles in the accommodation chamber are attached to the wafer during the plasma processing, a defect is caused in the semiconductor device. Accordingly, several techniques have been developed to remove such particles from the accommodation chamber before the plasma processing.

However, for example, a part of a component in the accommodation chamber may be worn out to generate particles during the plasma processing. Such particles are positively or negatively charged. If the plasma disappears after the plasma processing, a negative bias potential is generated on the wafer. Accordingly, after the plasma processing, positively charged particles may attracted and attached to the wafer by an electrostatic force.

For that reason, a technique has been developed to prevent a self bias potential from being generated on the wafer and positively charged particles from being attracted to the wafer by performing a plurality of plasma processings without any intervals between the plasma processings to continually generate plasmas when the wafer is subjected to the plasma processings (see, e.g., Japanese Patent Application Publication No. 2003-068708 and corresponding U.S. Patent Application Publication No. 2003/3758 A1).

Figure 4A:
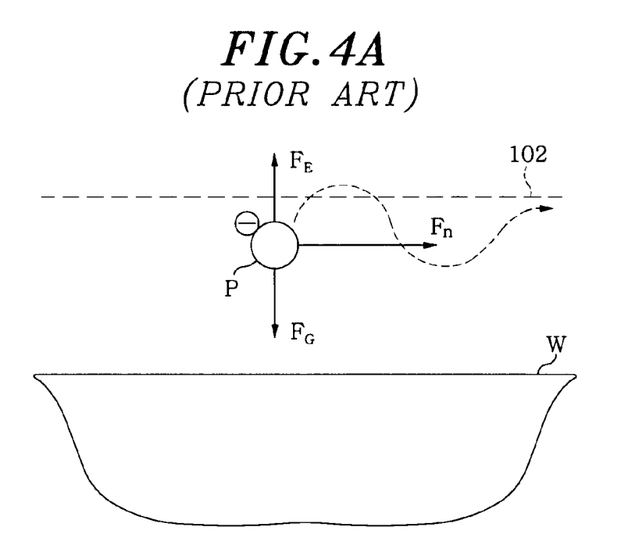
FIG. 4A shows vectors of each force by which a particle is affected.

As shown in FIG. 4A, during the plasma processing, a negatively charged particle is mainly affected by a gravity $F_G$, a force $F_E$ generated from an electric field caused by a bias power supplied to the mounting table, and a viscous force $F_N$ of a gas flowing inside the accommodation chamber.

Figure 4B:
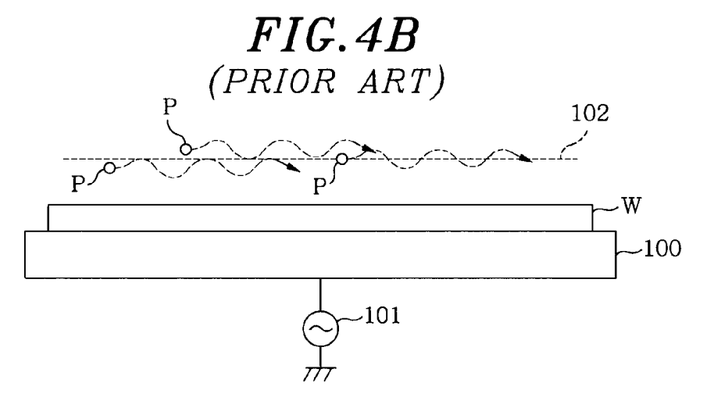
FIG. 4B shows how particles float over a wafer.

In a mounting table 100 to which a bias power is supplied from a bias power supply 101, a negative bias potential is generated. Accordingly, when the mounting table 100 is a lower electrode, the gravity $F_G$ and the force $F_E$ have opposite directions. If a particle P moves distantly from the mounting table 100 by a predetermined value, the gravity $F_G$ has the same magnitude as that of the force $F_E$. Therefore, the particle P stays there and floats around an interface of a sheath 102 over a wafer W by the viscous force $F_N$ as shown in a dotted line of FIG. 4B.

Figure 4C:
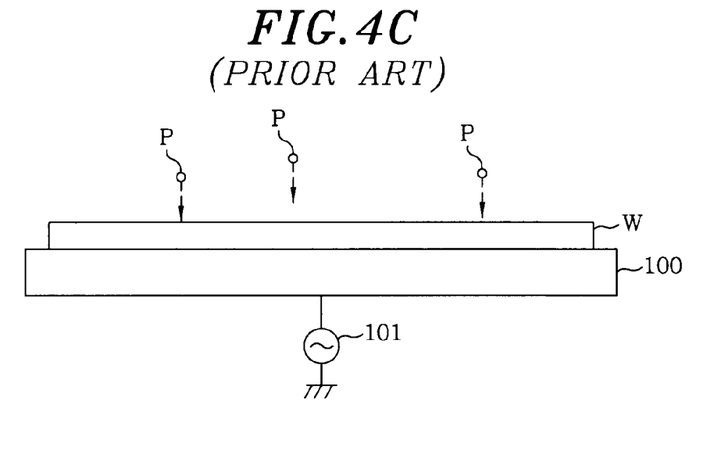
FIG. 4C shows how particles fall downwardly after a plasma processing.

However, after the plasma processing, if supplying the bias power from the bias power supply 101 is stopped, no force $F_E$ acts on the particle P. As a result, as shown in FIG. 4C, the particle P falls downwardly by the gravity $F_G$ to be attached to the wafer W.

SUMMARY OF THE INVENTION

In view of the above, the present invention provides a particle attachment preventing method and a substrate processing apparatus that can prevent a particle from being attached to a substrate.

In accordance with an aspect of the present invention, there is provided a particle attachment preventing method including: adjusting the electron density control power supplied from the second power supply such that the electron density above the substrate gets lower than during a plasma processing, for a preset short period of time after the plasma processing is ended; and maintaining the bias power supplied from the first power for the preset short period of time. The particle attachment preventing method is executable in the substrate processing apparatus including an accommodation chamber configured to accommodate a substrate therein and generate a plasma therein, a mounting table configured to mount the accommodated substrate thereon, a first power supply configured to supply a bias power for attracting the plasma to the mounting table, and a second power supply configured to supply an electron density control power for controlling an electron density above the substrate.

In accordance with another aspect of the present invention, there is provided a substrate processing apparatus including: an accommodation chamber configured to accommodate a substrate therein and generate a plasma therein; a mounting table configured to mount the accommodated substrate thereon; a first power supply configured to supply a bias power for attracting the plasma to the mounting table; and a second power supply configured to supply an electron density control power for controlling an electron density above the substrate. The electron density control power supplied from the second power supply is adjusted such that the electron density above the substrate gets lower than during a plasma processing, for a preset short period of time after the plasma processing is ended, and the bias power supplied from the first power supply is maintained for the preset short period of time.

BRIEF DESCRIPTION OF THE DRAWINGS

The objects and features of the present invention will become apparent from the following description of embodiments, given in conjunction with the accompanying drawings, in which:

FIGS. 3A and 3B show how particles are moved when an electron density of a wafer gets lower, FIGS. 4A to 4C show how particles are conventionally moved during a plasma processing.

DETAILED DESCRIPTION OF THE EMBODIMENTS

An embodiment of the present invention will now be described with reference to the accompanying drawings which form a part hereof.

Figure 1:
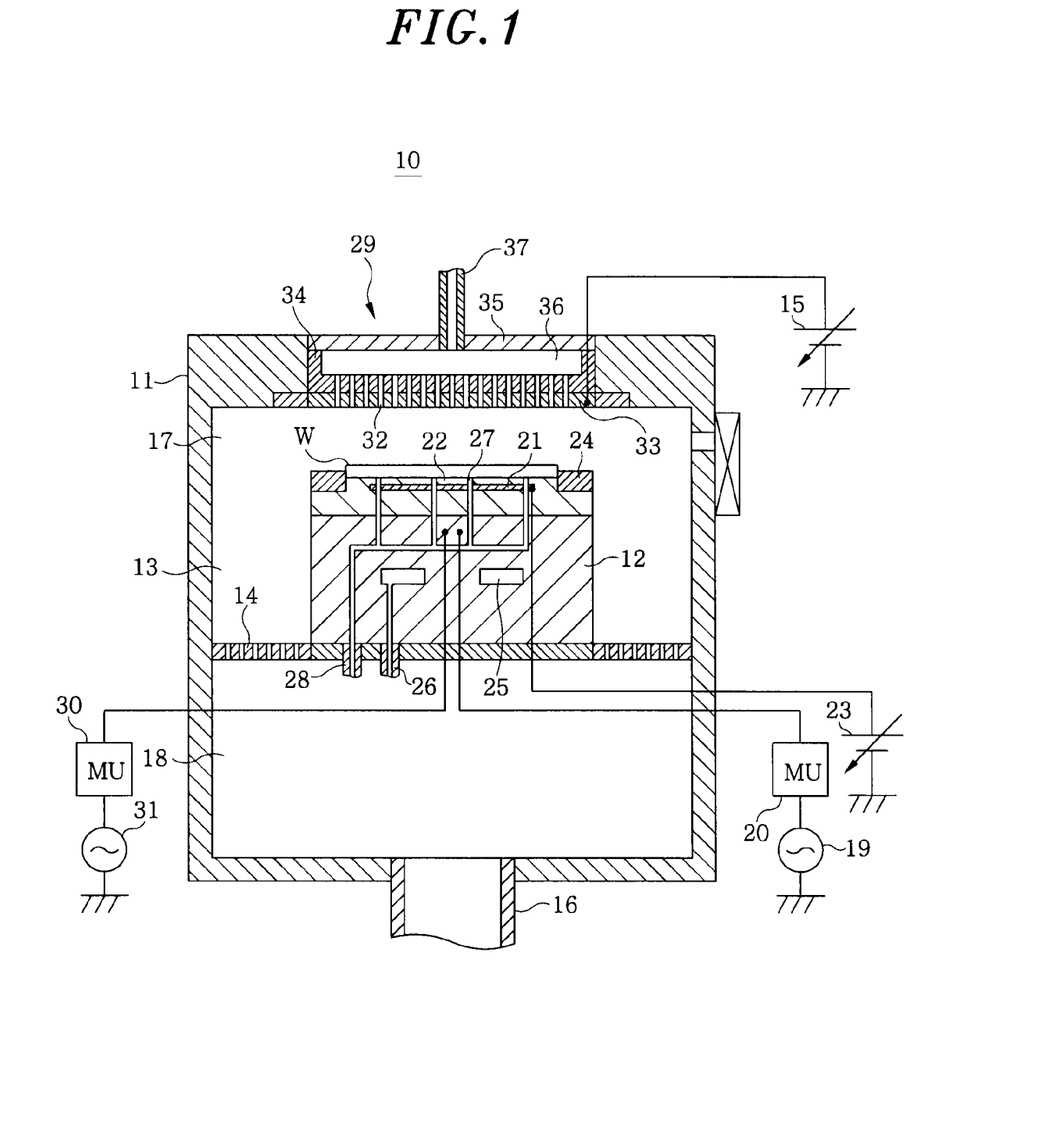
FIG. 1 is a schematic cross sectional view showing the structure of a substrate processing apparatus in accordance with an embodiment of the present invention.

FIG. 1 is a schematic cross sectional view showing the structure of a substrate processing apparatus 10 in accordance with an embodiment of the present invention. The substrate processing apparatus 10 is configured to subject a wafer to a dry etching process.

In FIG. 1, the substrate processing apparatus 10 includes: a chamber (accommodation chamber) 11 for accommodating a wafer having a diameter of, e.g., 300 mm therein; and a cylindrical susceptor (mounting table) 12 arranged inside the chamber 11 to mount the wafer for semiconductor devices thereon. The substrate processing apparatus 10 further includes: a side exhaust passageway 13 serving as a path through which a gas above the susceptor 12 is exhausted to an outside of the chamber 11, the side exhaust passageway 13 being defined by an inner wall of the chamber 11 and a side surface of the susceptor 12; and an exhaust plate 14 arranged in the side exhaust passageway 13. The exhaust plate 14, which is a plate shaped member having a plurality of holes, serves as a partition wall that divides an inside of the chamber 11 into an upper space 17 and a lower space 18. A plasma is generated in the upper space (hereinafter, referred to as a reaction chamber) 17 of the chamber 11 divided by the exhaust plate 14. An exhaust pipe 16 exhausting a gas inside the chamber 11 is connected to the lower space (hereinafter, referred to as an exhaust chamber (manifold)) 18 of the chamber 11. The exhaust plate is used to prevent a plasma generated in the reaction chamber 17 from leaking to the manifold 18 by capturing and reflecting the plasma.

A turbo molecular pump (TMP) (not shown) and a dry pump (DP) (not shown) are connected to the exhaust pipe 16 to exhaust the inside of the chamber 11 to a vacuum level. Specifically, the DP lowers the pressure inside the chamber from an atmospheric pressure to a medium vacuum state (e.g., $1.3 \times 10$ Pa (0.1 Torr) or less) and the TMP cooperates with the DP to lower the pressure inside the chamber 11 from the medium vacuum state to a high vacuum state (e.g., $1.3 \times 10^{-3}$ Pa ($1.0 \times 10^{-5}$ Torr) or less). The pressure inside the chamber 11 is controlled by an automatic pressure control (APC) valve.

A first high frequency power supply (first power supply) 19 and a second high frequency power supply 31 are connected to the susceptor 12 inside the chamber 11 via a first matching unit (MU) 20 and a second matching unit (MU) 30, respectively. The second high frequency power supply 31 constitutes a second power supply having a function for controlling an electron density alone or by cooperating with a second DC power supply 15. The first high frequency power supply 19 supplies a bias power for attracting a plasma to the susceptor 12, i.e., a high frequency power of relatively low frequency, e.g., about 3.2 MHz to the susceptor 12 and the second high frequency power supply 31 supplies a power (electron density control power) (hereinafter, referred to as a plasma generation power) for generating a plasma, i.e., a high frequency power of relatively high frequency, e.g., about 40 MHz to the susceptor 12. The susceptor 12 serves as a lower electrode.

An electrostatic chuck 22 is arranged on a top surface of the susceptor 12 and an electrostatic electrode plate 21 is included inside the electrostatic chuck 22. The electrostatic chuck 22 has a shape in which a top circular plate shaped member is stacked on a bottom circular plate shaped member, wherein a diameter of the top circular plate shaped member is smaller than that of the bottom circular plate shaped member. The top and bottom circular plate shaped member of the electrostatic chuck 22 may be made of a ceramic.

A first DC power supply 23 is connected to the electrostatic electrode plate 21 in the electrostatic chuck 22. If a positive DC voltage is applied to the electrostatic electrode plate 21, a negative potential is applied on a surface (on the side of the electrostatic chuck 22) of the wafer W (hereinafter, referred to as a back surface of the wafer W), thereby generating a potential difference between the electrostatic electrode plate 21 and the back surface of the wafer W. As a result, the wafer W is attracted to and held on the top circular plate shaped member of the electrostatic chuck 22 under the action of a Coulomb force or a Johnson-Rahbek force generated by the potential difference.

A ring-shaped focus ring 24 is mounted on the electrostatic chuck 22 to surround the wafer W attracted and held on the electrostatic chuck 22. The focus ring 24 is made of a conductor, e.g., a single crystalline silicon, same as the material of the wafer W. Since the focus ring 24 is made of a conductor, the distribution region of plasma is extended to above the focus ring 24 as well as the wafer W and the density of plasma at a peripheral portion of the wafer W is maintained to be identical to that of plasma at a center portion of the wafer W. Accordingly, it is possible to maintain the uniformity of the dry etching process over the entire surface of the wafer W.

An annular coolant path 25 is provided in the susceptor 12, extending in, e.g., a circumstantial direction. A coolant, e.g., a cooling water or Galden (Registered trademark), of low temperature is supplied from a chiller unit (not shown) to the coolant path 25 via a coolant line 26 to be circulated. The susceptor 12 is cooled by the low-temperature coolant and the electrostatic chuck 22, the wafer W, and the focus ring 24 are cooled by the cooled susceptor 12.

A plurality of heat transfer gas supply holes 27 are formed at a region (hereinafter, referred to as an attraction surface), in which the wafer W is attracted and held, of a top surface of the top circular plate shaped member of the electrostatic chuck 22. The heat transfer gas supply holes 27 are connected to a heat transfer gas supply unit (not shown) via a heat transfer gas supply line 28 and a heat transfer gas, e.g., helium (He) gas, is supplied from the heat transfer gas supply unit to a gap between the attraction surface and the back surface of the wafer W via the heat transfer gas supply holes 27. A heat of the wafer W is efficiently transferred to the electrostatic chuck 22 through the He gas supplied to the gap between the attraction surface and the back surface of the wafer W.

In a ceiling portion of the chamber 11, a shower head 29 is arranged to face the susceptor 12. The shower head 29 includes: an upper electrode 33 (opposite electrode), i.e., a conductive circular plate having a plurality of gas holes 32; a cooling plate 34 configured to detachably hold the upper electrode 33; and a cover 35 configured to cover the cooling plate 34. A buffer chamber 36 is provided inside the cooling plate 34 and a processing gas inlet pipe 37 is connected to the buffer chamber 36. The second DC power supply 15 is connected to the upper electrode 33 and a DC power (electron density control power) is supplied from the second DC power supply 15 to the upper electrode 33. The second DC power supply 15 constitutes the second power supply having a function for controlling an electron density alone or by cooperating with the second high frequency power supply 31.

In the substrate processing apparatus 10, the processing gas supplied from the processing gas inlet pipe 37 to the chamber 11 is introduced into the reaction chamber 17 via the gas holes 32. Then, the introduced processing gas is excited by the plasma generation power supplied from the second high frequency power supply 31 to the reaction chamber 17 via the susceptor 12, to thereby be converted into a plasma. Positive ions in the plasma are attracted to the wafer W mounted on the susceptor 12 by a negative bias potential caused by the bias power supplied to the susceptor 12, so that the wafer W is dry-etched.

In the substrate processing apparatus 10, during the dry etching process, a negative DC power is supplied from the second DC power supply 15 to the upper electrode 33 and thus secondary electrons are emitted from the upper electrode 33. Since the amount of the emitted secondary electrons is adjusted according to a value of the DC power supplied to the upper electrode 33, the electron density inside the reaction chamber 17, especially, above the wafer W can be controlled by changing the value of the DC power supplied to the upper electrode 33. Moreover, since the production of plasma is adjusted according to a value of the plasma generation power supplied to the reaction chamber 17, the electron density inside the reaction chamber 17, especially, above the wafer W can be controlled by changing the value of the plasma generation power supplied from the second high frequency power supply 31.

The operations of various components, e.g., the first and the second high frequency power supply 19 and 31 and the second DC power supply 15, of the substrate processing apparatus 10 are controlled by a program related to the dry etching process performed by a central processing unit (CPU) of a controller (not shown) included in the substrate processing apparatus 10.

However, as described above, negatively charged particles float around an interface of a sheath over a wafer W during the dry etching process in the substrate processing apparatus 10. If the supplying of the bias power from the first high frequency power supply 19 is stopped after the dry etching process is ended, such particles may fall downwardly and be attached to the wafer W by the gravity. Accordingly, it is necessary to remove the particles from above the wafer W before the supplying of the bias power is stopped.

Accordingly, in the present embodiment, the negatively charged particles are removed from above the wafer W by using a force $F_E$ generated from an electric field. Specifically, the particles are bounded away from above the wafer W by impulsively applying the force $F_E$ to the particles.

Figure 2:
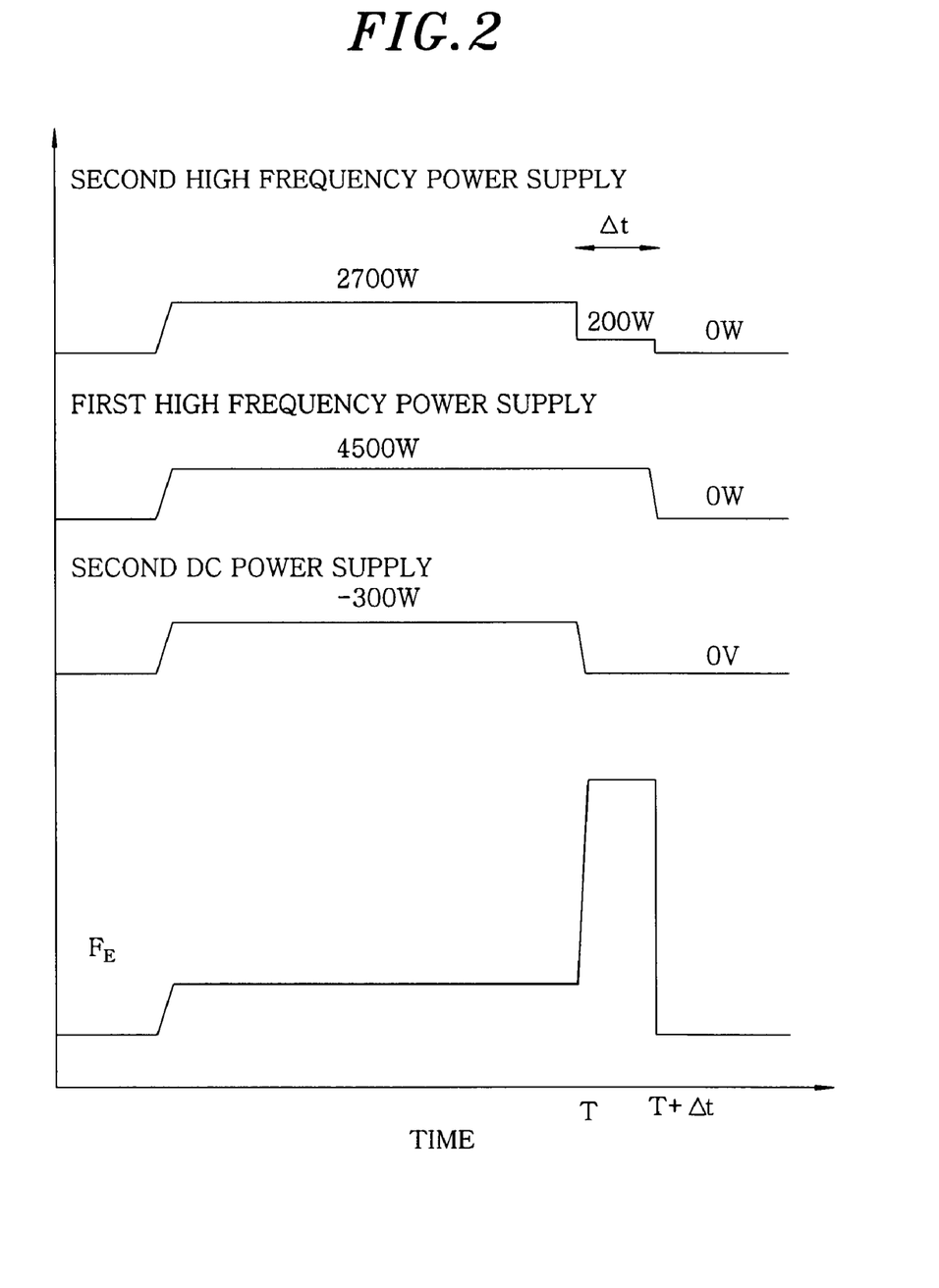
FIG. 2 shows a power control sequence as a particle attachment preventing method in accordance with the embodiment of the present invention.

FIG. 2 shows a power control sequence as a particle attachment preventing method in accordance with the embodiment of the present invention.

As shown in FIG. 2, in the substrate processing apparatus 10, during the dry etching process (time T), a plasma generation power of 2700 W having a frequency of 40 MHz is supplied from the second high frequency power supply 31 to the susceptor 12 and a bias power of 4500 W having a frequency of 3.2 MHz is supplied from the first high frequency power 19 to the susceptor 12. Moreover, a DC power of −300 V is supplied from the second DC power supply 15 to the upper electrode 33.

After the dry etching process is ended, it is immediately stopped supplying the DC power from the second DC power supply 15 to the upper electrode 33, while the plasma generation power supplied from the second high frequency power supply 31 is lowered from 2700 W to 200 W and maintained in 200 W during a preset short period of time ($\Delta t$). When the supplying of the DC power from the second DC power supply 15 is stopped, emission of the secondary electrons is also stopped. When the plasma generation power is lowered, generation of the plasma is suppressed. Accordingly, the electron density inside the reaction chamber 17, especially, above the wafer W, gets lower than that during the dry etching process. Meanwhile, the bias power supplied from the first high frequency power supply 19 is maintained in 4500 W during the preset short period of time ($\Delta t$).

Figure 3A:
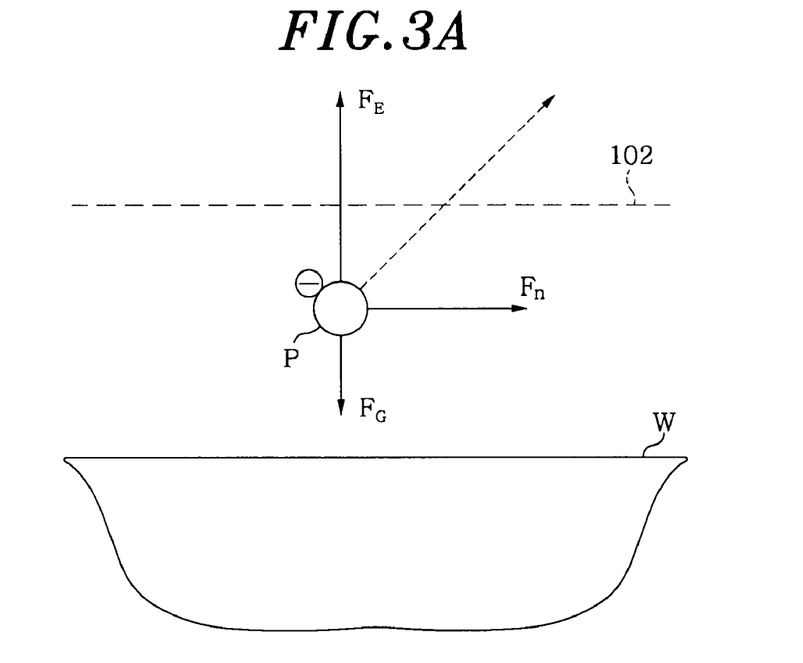
FIG. 3A shows vectors of each force by which a particle is affected.
Figure 3B:
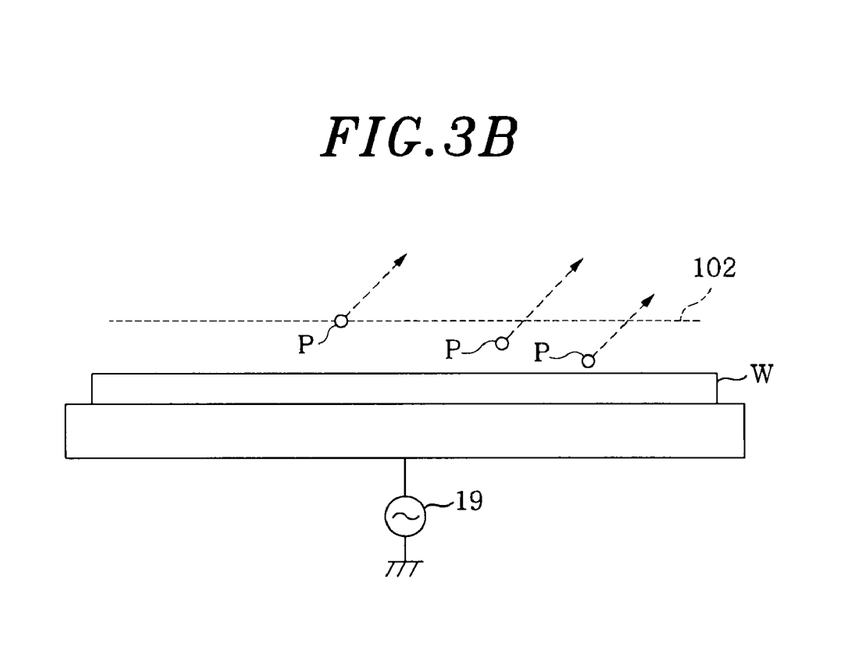
FIG. 3B shows how particles are removed from a wafer.

FIGS. 3A and 3B show how particles P are moved when an electron density above a wafer gets lower, FIG. 3A shows vectors of each force by which each of the particles P are affected, and FIG. 3B shows how the particles P are removed from above the wafer.

If the electron density is lowered, the electrostatic shielding effect of plasma becomes weaker. Accordingly, an influence of a negative bias potential of the susceptor 12 is increased and thus the force $F_E$ (generated from the electric field) by which the particles P are affected is rapidly increased. At this time, the force $F_E$ is increased much more than the gravity $F_G$. Accordingly, a balance between the gravity $F_G$ and the force $F_E$ is broken and the particles P are removed from above the wafer W by the force $F_E$.

In more detail, since the electron density above the wafer W is lowered during the preset short period of time as described above, the respective particles P are impulsively affected by the force $F_E$, thereby being bounded away from above the wafer W. Further, the respective particles P are affected by a viscous force $F_N$ of a gas flowing along the surface of the wafer W. Accordingly, the particles P are bounded away obliquely with respect to the surface of the wafer W as shown in FIG. 3B instead of being bounded in a vertically upward direction with respect to the surface of the wafer W. Therefore, the obliquely bounded particles P hardly fall downwardly to the wafer W again.

After a lapse of the preset short period of time (T+$\Delta t$), the supplying of the plasma generation power from the second high frequency power supply 31 and the bias power from the first high frequency power supply 19 are stopped. Thereafter, this sequence is ended.

A certain response time is required for the electron density above the wafer to change in response to the change of the plasma generation power. If the period of time that the plasma generation power is lowered is shorter than 0.5 seconds, the electron density above the wafer is not sufficiently lowered. Moreover, if the plasma generation power is changed and maintained in the changed state for 10 seconds or more, newly generated particles arrive and float over the wafer W, other than the particles P bounded away from above the wafer W. Accordingly, in the power control sequence, the period of time that the plasma generation power is lowered is set as 0.5 to 1.0 second.

In the power control sequence, since a process of removing the particles P is significantly affected by the change of the electron density, the substrate processing apparatus 10 includes a device (not shown) for measuring the electron density inside the reaction chamber 17.

In accordance with the power control sequence shown in FIG. 2, immediately after the dry etching process is ended, the supplying of the DC power to the upper electrode 33 is stopped and the plasma generation power supplied to the susceptor 12 is lowered from 2700 W to 200 W and maintained in 200 W for 0.5 to 1.0 second. However, the bias power supplied to the susceptor 12 is maintained in 4500 W for the 0.5 to 1.0 second. Lowering the plasma generation power causes the generation of plasma to be suppressed and stopping the supplying of the DC power causes the emission of secondary electrons from the upper electrode 33 to be stopped. Accordingly, the electron density above the wafer W gets lower than during the dry etching process.

If the electron density above the wafer W is lowered during a short period of time, i.e., 0.5 to 1.0 second, a negative bias potential caused by the bias power supplied to the susceptor 12 is rapidly decreased but the force $F_E$ (generated from the electric field) by which the particles P floating over the wafer W is affected is rapidly increased. Therefore, a balance between the gravity $F_G$ and the force $F_E$ is broken and the particles P are impulsively affected by the force $F_E$, thereby being bounded away from the wafer W. As a result, it is possible to prevent the particles P from being attached to the wafer W.

In the power control sequence shown in FIG. 2, after the dry etching process is ended, the supplying of the DC power is stopped and the plasma generation power is lowered. However, it is sufficient to satisfy one of the two conditions, that is, the supplying of the DC power is stopped or the plasma generation power is lowered. Even in either case, the electron density above the wafer W gets lower than during the dry etching process. Accordingly, the force $F_E$ by which the particles P are affected is reliably increased, to thereby remove the particles P from above the wafer W. Especially, since the emission of the secondary electrons is stopped immediately after the supplying of the DC power is ended, it is preferable to stop the supplying of the DC power considering the responsibility of the control of the electron density.

Alternatively, the DC power may be lowered instead of stopping the supplying of the DC power. Lowering the DC power causes the emission of the secondary electrons from the upper electrode 33 to be suppressed. Accordingly, the electron density above the wafer W may get lower than during the dry etching process.

In the power control sequence shown in FIG. 2, the supplying of the DC power is stopped and the plasma generation power is lowered. However, after the dry etching process is ended, the supplied bias power may be increased without the change of the supplied DC power and plasma generation power. If the supplied bias power is increased, the negative bias potential of the susceptor 12 is decreased (however, an absolute value of the potential difference is increased) due to the increase of the bias power. Accordingly, the force $F_E$ by which the particles P are affected may be increased.

In the substrate processing apparatus 10, the reaction chamber 17 (first region) in which the plasma generation power is supplied to generate a plasma includes a space (second region) above the wafer W in which the wafer W is subjected to a plasma processing. Accordingly, an influence of the lowered plasma generation power may be immediately reflected to the space above the wafer W, thereby quickly decreasing the electron density above the wafer W.

Moreover, although, in the substrate processing apparatus 10, the region (hereinafter, referred to as "plasma generation region") in which the plasma generation power is supplied to generate a plasma includes the region (hereinafter, referred to as "processing region") in which the wafer W is subjected to a plasma processing, it is sufficient that the plasma generation region is adjacent to the processing region. When the plasma generation region is adjacent to the processing region, the influence of the lowered plasma generation power in the plasma generation region may be immediately reflected to the processing region, thereby quickly decreasing the electron density in the space above the wafer W, included in the processing region.

In other words, the power control sequence shown in FIG. 2 can be applied to a parallel plate type etching apparatus such as the substrate processing apparatus described above and also other apparatuses, e.g., an electron cyclotron resonance (ECR) sputter apparatus, an inductive coupling plasma (ICP) apparatus, and especially, a transformer coupling plasma (TCP) apparatus.

In the substrate processing apparatus 10, the plasma generation power is supplied to the susceptor 12. Alternatively, once the bias power is supplied to the susceptor 12, the plasma generation power may be supplied to the upper electrode 33. When the bias power is supplied to the susceptor 12 and the plasma generation power is supplied to the upper electrode 33, lowering the plasma generation power causes the electron density inside the reaction chamber 17 to be decreased, thereby reducing the negative bias potential of the susceptor 12.

Although the substrate to be subjected to the dry etching process is a wafer for semiconductor devices in the present embodiment, the substrate is not limited thereto. For example, the substrate may be a glass substrate for use in a liquid crystal display (LCD) or a flat panel display (FPD).

The purpose of the present invention is also achieved by providing a computer (e.g. a controller) with a storage medium storing program codes of software realizing the operations of the present embodiment and allowing a central processing unit (CPU) of the computer to read and execute the program codes stored in the storage medium.

In this case, the program codes themselves read from the storage medium realize the functions of the aforementioned embodiment, and thus the present invention includes the program codes and the storage medium storing the program codes.

The storage medium for providing the program codes may be, e.g., a RAM, an NV-RAM, a floppy (registered trademark) disk, a hard disk, a magneto-optical disk, an optical disk such as CD-ROM, CD-R, CD-RW, and DVD (DVD-ROM, DVD-RAM, DVD-RW, and DVD+RW), a magnetic tape, a non-volatile memory card, or other types of ROM capable of storing the program codes. The program codes may be provided to the computer by being downloaded from another computer or a database, which is not shown, connected to the Internet, a commercial use network, a local area network, or the like.

The operations of the aforementioned embodiment can be realized by executing the program codes read by the computer or by the actual processing partially or wholly executed by an operating system (OS) operated on the CPU according to the instructions of the program codes.

In addition, the operations may also be realized by the actual processing partially or wholly executed by a CPU or the like in a built-in function extension board or an external function extension unit of a computer according to the instructions of program codes read from a storage medium after the program codes are inputted into a memory in the built-in function extension board or the external function extension unit.

The program codes may be object codes, program codes executed by an interpreter, script data provided to an operating system, or the like.

Next, test and comparative examples of the present embodiment will be described.

TEST EXAMPLES (TE) 1 TO 5

In the substrate processing apparatus 10, when the power control sequence shown in FIG. 2 was performed in processes A to E having different recipes (pressure inside the reaction chamber 17, a setting value of plasma generation power, and a setting value of the bias power), the number of particles having a diameter of 0.08 µm or less, attached to the surface of the wafer W was counted. The following table 1 shows the counted number of the particles according to test examples 1 to 5. In the power control sequence, after the dry etching process, the plasma generation power was lowered to 40% or less as compared with the plasma generation power during the dry etching process.

COMPARATIVE EXAMPLES (CE) 1 TO 5

In the substrate processing apparatus 10, when a conventional power control sequence was performed in the processes A to E, the number of particles having a diameter of 0.08 μm or less, attached to the surface of the wafer W was counted. The following table 1 shows the counted number of the particles according to comparative examples 1 to 5. In the conventional power control sequence of the comparative examples 1 to 5, the supplying of the DC power to the upper electrode 33 and the supplying of the plasma generation power and the bias power are ended immediately after the dry etching process.

TABLE 1

| Process A | CE 1 | TE 1 |
|---|---|---|
| | 35 | 5 |
| Process B | CE 2 | TE 2 |
| | 322 | 11 |
| Process C | CE 3 | TE 3 |
| | 36 | 5 |
| Process D | CE 4 | TE 4 |
| | 227 | 9 |
| Process E | CE 5 | TE 5 |
| | 39 | 8 |

TEST EXAMPLE 6

In the substrate processing apparatus 10, when the power control sequence (no bias power is supplied) shown in FIG. 2 was performed in a process F that supplies the plasma generation power and the DC power to the upper electrode 33, the number of particles having a diameter of 0.08 μm or less, attached to the surface of the wafer W was counted. The following table 2 shows the counted number of the particles according to a test example 6. In the power control sequence, after the dry etching process, the plasma generation power was also lowered to 40% or less as compared with the plasma generation power during the dry etching process.

COMPARATIVE EXAMPLE 6

In the substrate processing apparatus 10, when the conventional power control sequence was performed in the process F, the number of particles having a diameter of 0.08 μm or less, attached to the surface of the wafer W was counted. The following table 2 shows the counted number of the particles according to a comparative example 6. In the conventional power control sequence of the comparative example 6, the supplying of the plasma generation power and the supplying of the DC power to the upper electrode 33 are ended immediately after the dry etching process.

TABLE 2

| Process F | CE 6 | TE 6 |
|---|---|---|
| | 2116 | 3 |

TEST EXAMPLES 7 AND 8

In the substrate processing apparatus 10, when the power control sequence (no DC power is supplied to the upper electrode 33) shown in FIG. 2 was performed in processes G and H that supply the plasma generation power and the bias power, the number of particles having a diameter of 0.08 μm or less, attached to the surface of the wafer W was counted. The following table 3 shows the counted number of the particles according to test examples 7 and 8. In the power control sequence, after the dry etching process, the plasma generation power was also lowered to 40% or less as compared with the plasma generation power during the dry etching process.

COMPARATIVE EXAMPLES 7 AND 8

In the substrate processing apparatus 10, when the conventional power control sequence was performed in the processes G and H, the number of particles having a diameter of 0.08 μm or less, attached to the surface of the wafer W was counted. The following table 3 shows the counted number of the particles according to comparative examples 7 and 8. In the conventional power control sequence of the comparative examples 7 and 8, the supplying of the plasma generation power and the bias power are ended immediately after the dry etching process.

TABLE 3

| Process G | CE 7 | TE 7 |
|---|---|---|
| | 28 | 4 |
| Process H | CE 8 | TE 8 |
| | 15 | 1 |

As the results of comparing the test examples 1 to 5 with the comparative examples 1 to 5, the test example 6 with the comparative example 6, and the test examples 7 and 8 with the comparative examples 7 and 8, it can be seen that it is possible to reduce the number of the particles attached to the surface of the wafer W when the power control sequence shown in FIG. 2 is performed. Accordingly, if the plasma generation power is lowered to 40% or less as compared with the plasma generation power during the dry etching process, the electron density above the wafer W is sufficiently lowered as compared with the electron density during the dry etching process; the force $F_E$ (generated from the electric field) by which the particles floating over the wafer W are affected is sufficiently increased; and the particles are prevented from being attached to the surface of the wafer W.

While the invention has been shown and described with respect to the embodiments, it will be understood by those skilled in the art that various changes and modification may be made without departing from the scope of the invention as defined in the following claims.

What is claimed is:

1. A particle attachment preventing method in a substrate processing apparatus including an accommodation chamber configured to accommodate a substrate therein and generate a plasma therein, a mounting table configured to mount the accommodated substrate thereon, a first power supply configured to supply a bias power for attracting the plasma to the mounting table, and a second power supply configured to supply an electron density control power for controlling an electron density above the substrate, the method comprising:
adjusting the electron density control power supplied from the second power supply such that the electron density above the substrate gets lower than during a plasma processing, for a preset short period of time after the plasma processing is ended; and maintaining the bias power supplied from the first power for the preset short period of time, wherein the preset short period of time is about 0.5 to 1.0 second.

2. The method of claim 1, wherein the second power supply is a high frequency power supply for supplying a high frequency power having a frequency that is higher than that of the bias power, and in said adjusting of the electron density control power, the high frequency power supplied from the second power supply is lowered as compared with that during the plasma processing.

3. The method of claim 1, wherein the substrate processing apparatus further includes an opposite electrode facing the mounting table, the second power supply serves as a DC power supply for supplying a DC power to the opposite electrode, and in said adjusting of the electron density control power, the DC power supplied from the second power supply is lowered as compared with that during the plasma processing.

4. The method of claim 1, wherein the substrate processing apparatus further includes an opposite electrode facing the mounting table, the second power supply serves as a high frequency power supply for supplying a high frequency power having a frequency that is higher than that of the bias power and a DC power supply for supplying a DC power to the opposite electrode, and in said adjusting of the electron density control power, the DC power supplied from the second power supply is lowered as compared with that during the plasma processing and the high frequency power supplied from the second power supply is lowered as compared with that during the plasma processing.

5. The method of claim 2, wherein, in said adjusting of the electron density control power, the high frequency power supplied from the second power supply is lowered to about 40% or less of the high frequency power during the plasma processing.

6. The method of claim 4, wherein, in said adjusting of the electron density control power, the high frequency power supplied from the second power supply is lowered to about 40% or less of the high frequency power during the plasma processing.

7. A substrate processing apparatus comprising:

an accommodation chamber configured to accommodate a substrate therein and generate a plasma therein;

a mounting table configured to mount the accommodated substrate thereon;

a first power supply configured to supply a bias power for attracting the plasma to the mounting table; and a second power supply configured to supply an electron density control power for controlling an electron density above the substrate, wherein the electron density control power supplied from the second power supply is adjusted such that the electron density above the substrate gets lower than during a plasma processing, for a preset short period of time after the plasma processing is ended, and the bias power supplied from the first power supply is maintained for the preset short period of time, and wherein the preset short period of time is about 0.5 to 1.0 second.

8. The apparatus of claim 7, wherein the electron density control power is a power for generating the plasma, and a first region in which the electron density control power is supplied to generate the plasma and a second region in which the substrate is subjected to the plasma processing are identical or adjacent to each other.

* * * * *